United States Patent [19]

Yoshioka

[11] Patent Number: 5,701,169
[45] Date of Patent: Dec. 23, 1997

[54] ILLUMINATION SYSTEM AND EXPOSURE APPARATUS WITH DEMOUNTABLE TRANSPARENT PROTECTIVE MEMBER

[75] Inventor: Hitoshi Yoshioka, Utsunomiya, Japan

[73] Assignee: Canon Kabushiki Kaisha, Tokyo, Japan

[21] Appl. No.: 651,006

[22] Filed: May 21, 1996

Related U.S. Application Data

[63] Continuation of Ser. No. 413,264, Mar. 30, 1995, abandoned.

[30] Foreign Application Priority Data

Mar. 30, 1994 [JP] Japan ................... 6-085946

[51] Int. Cl.⁶ .................. H01L 21/30; G03F 7/20
[52] U.S. Cl. .................. 355/30; 355/67
[58] Field of Search .................. 355/30, 53, 67, 355/71; 359/507, 509, 511–14

[56] References Cited

U.S. PATENT DOCUMENTS

| | | | |
|---|---|---|---|
| 2,317,691 | 4/1943 | Morin | 355/30 |
| 4,480,910 | 11/1984 | Takanashi et al. | 355/30 |
| 4,509,852 | 4/1985 | Tabarelli et al. | 355/30 |
| 4,630,922 | 12/1986 | Imai et al. | 355/55 |
| 4,634,270 | 1/1987 | Yokoo et al. | 355/125 |
| 4,657,805 | 4/1987 | Fukumitsu et al. | 428/215 |
| 4,763,169 | 8/1988 | Jackson | 355/30 |
| 4,931,830 | 6/1990 | Suwa et al. | 355/71 |
| 5,160,962 | 11/1992 | Miura et al. | 355/53 |

FOREIGN PATENT DOCUMENTS

| | | | |
|---|---|---|---|
| 59-99426 | 6/1984 | Japan. | |
| 60-214335 | 10/1985 | Japan. | |
| 61-171126 | 8/1986 | Japan | 355/30 |
| 2-210813 | 8/1990 | Japan. | |
| 4-128702 | 4/1992 | Japan. | |
| 6-202243 | 7/1994 | Japan. | |
| 2138163 | 10/1984 | United Kingdom. | |

*Primary Examiner*—Joan H. Pendegrass
*Attorney, Agent, or Firm*—Fitzpatrick, Cella, Harper & Scinto

[57] ABSTRACT

An illumination system includes an optical system for receiving light from a light source, a barrel for accommodating the light source and the optical system therein, the barrel having an inside gas containing a material which may cause blur of an optical element of the optical system, and a transparent protecting member demountably mountable on the barrel, for protecting the optical system against the material.

60 Claims, 9 Drawing Sheets

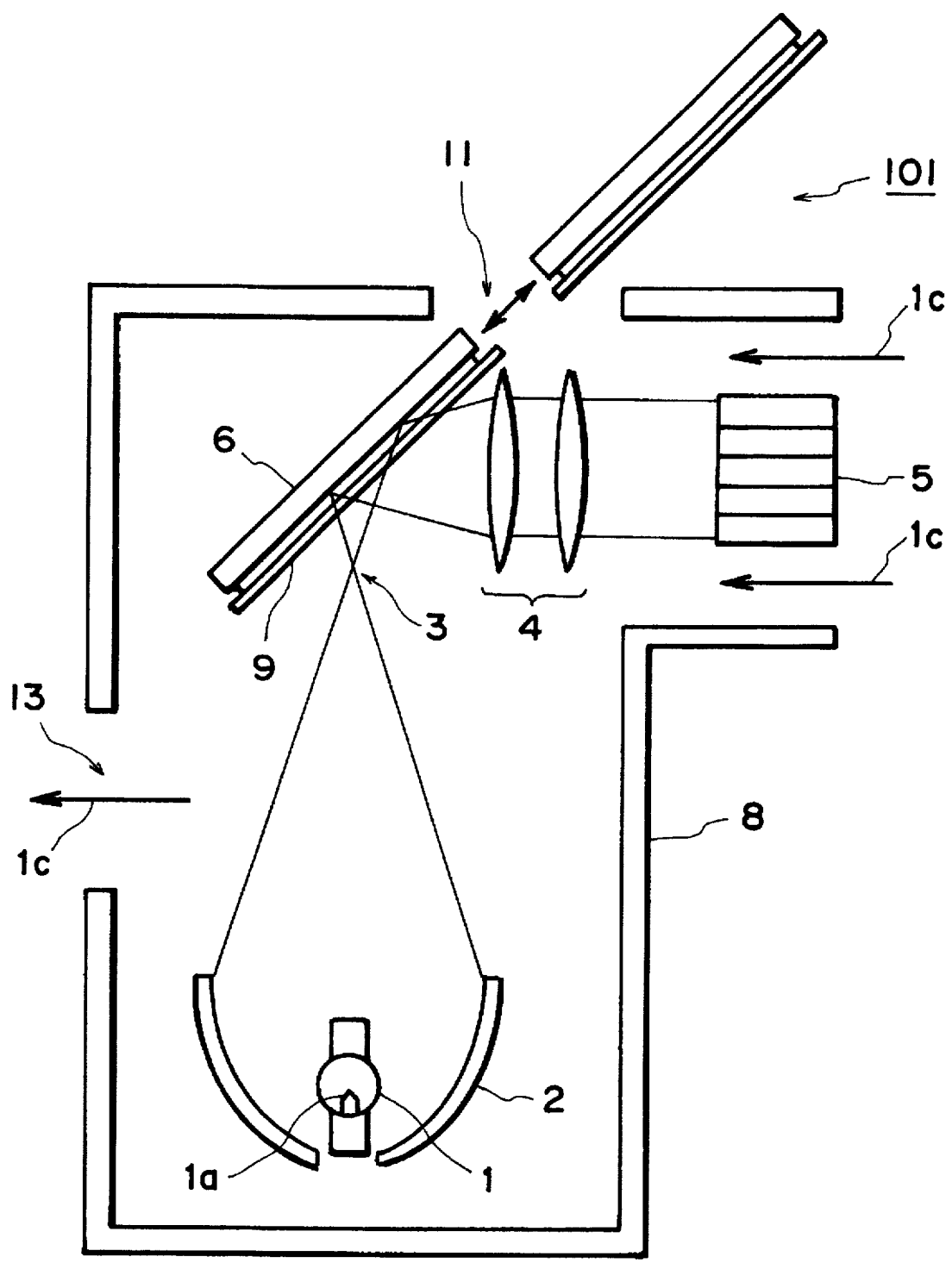
F I G. 5

ILLUMINATION SYSTEM AND EXPOSURE APPARATUS WITH DEMOUNTABLE TRANSPARENT PROTECTIVE MEMBER

This application is a continuation of application Ser. No. 08/413,264, filed Mar. 30, 1995, now abandoned.

FIELD OF THE INVENTION AND RELATED ART

This invention relates generally to an illumination system and an exposure apparatus using the same. More particularly, the invention is directed to a technique applicable to a projection exposure apparatus, for example, for use in a lithographic process in the manufacture of devices such as semiconductor devices, for preventing blur or cloudiness of an optical element such as a mirror or a lens element to be caused by adhesion, thereto, of floating chemical materials, being chemically changed, which materials are floating in air around a light source or in air about a portion to which light from the light source is concentrated.

In a projection exposure apparatus called a stepper, which is one type of the exposure apparatuses for the manufacture of semiconductor devices, a reticle having an electronic circuit pattern formed thereon is illuminated with light from an illumination system, and the pattern formed on the reticle surface is projected onto the surface of a wafer through a projection lens in a reduced scale.

FIG. 1 is a schematic view of an optical arrangement of an illumination system of a known projection exposure apparatus, being provided about an exposure light source.

Denoted in the drawing at 2 is an elliptical mirror. Denoted at 1 is a light emitting tube (light source) which has a high luminance light emitting portion 1a for emitting ultraviolet rays or deep ultraviolet rays, for example. The light emitting portion 1a is disposed close to the first focal point of the elliptical mirror 2. The elliptical mirror 2 serves to form an image (light source image) 1b of the light emitting portion 1a, at a position adjacent to the second focal point 3 thereof.

Denoted at 4 is an optical system which comprises a condenser lens or a zoom lens. The optical system 4 serves to direct the light from the light emitting portion image 1b as formed adjacent to the second focal point 3, toward the light entrance surface 5a of an optical integrator 5. The light exits from the light exit surface 5b of the optical integrator 5, and it is collected by a condensing optical system (not shown) and illuminates the surface to be illuminated (not shown).

Denoted at 8 is a lamp house (housing). Denoted at 13 is an exhaust port formed in a portion of the lamp house 8. It serves to exhaust air in the lamp house 8, having its temperature raised by lighting the light source 1. Arrow 1c depicts the flow of gas such as air. Denoted at 7 is a holding member for holding the optical system 4. Denoted at 20a–20d are mechanical clearances (openings) of the lamp house 8 through which outside air is introduced thereinto by a pressure difference between the inside and outside of the lamp house produced by gas exhaustion.

In a clean room in which the projection exposure apparatus of FIG. 1 is accommodated, various chemical materials, such as a resist to be used for the projection exposure, are used continuously or repeatedly. Such chemical material may be evaporated, so that in the air within the clean room there may be a small amount of chemical impurities mixed.

In the projection exposure apparatus of FIG. 1, the air in the clean room may be directly used as cooling air and, therefore, a Hg lamp or other optical components about the lamp may be placed in the air which contains chemical impurities. Such chemical impurities may change chemically due to heat or intense ultraviolet rays produced by the Hg lamp, and they may be adhered to or deposited onto the Hg lamp or other optical component to cause blur or cloudiness of the same.

If, for example, the ambience air around an optical component contains $NH_4^+$, $SO_4^{2-}$ or any other ions, then $(NH_4)SO_4$ may be produced, which in turn may be deposited on the optical component such as a lamp, a mirror or a lens to cause white cloudiness thereof.

Conventionally, if such cloudiness occurs, the blurred optical component has to be demounted from the illumination system and cleaned by use of a cleaning chemical agent. Alternatively, such a blurred optical component has to be changed by a fresh one.

SUMMARY OF THE INVENTION

It is an object of the present invention to provide an illumination system by which blur of an optical component or components is effectively avoided.

It is another object of the present invention to provide an exposure apparatus having such an illumination system.

In accordance with an aspect of the present invention, there is provided an illumination system, comprising: an optical system for receiving light from a light source; a barrel for accommodating the light source and said optical system therein, said barrel having an inside gas containing a material which may cause blur of an optical element of said optical system; and a transparent protecting member demountably mountable on said barrel, for protecting said optical system against said material.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 5 is a schematic view of a main portion of an illumination system according to a second embodiment of the present invention.

DESCRIPTION OF THE PREFERRED EMBODIMENTS

Figure 1:
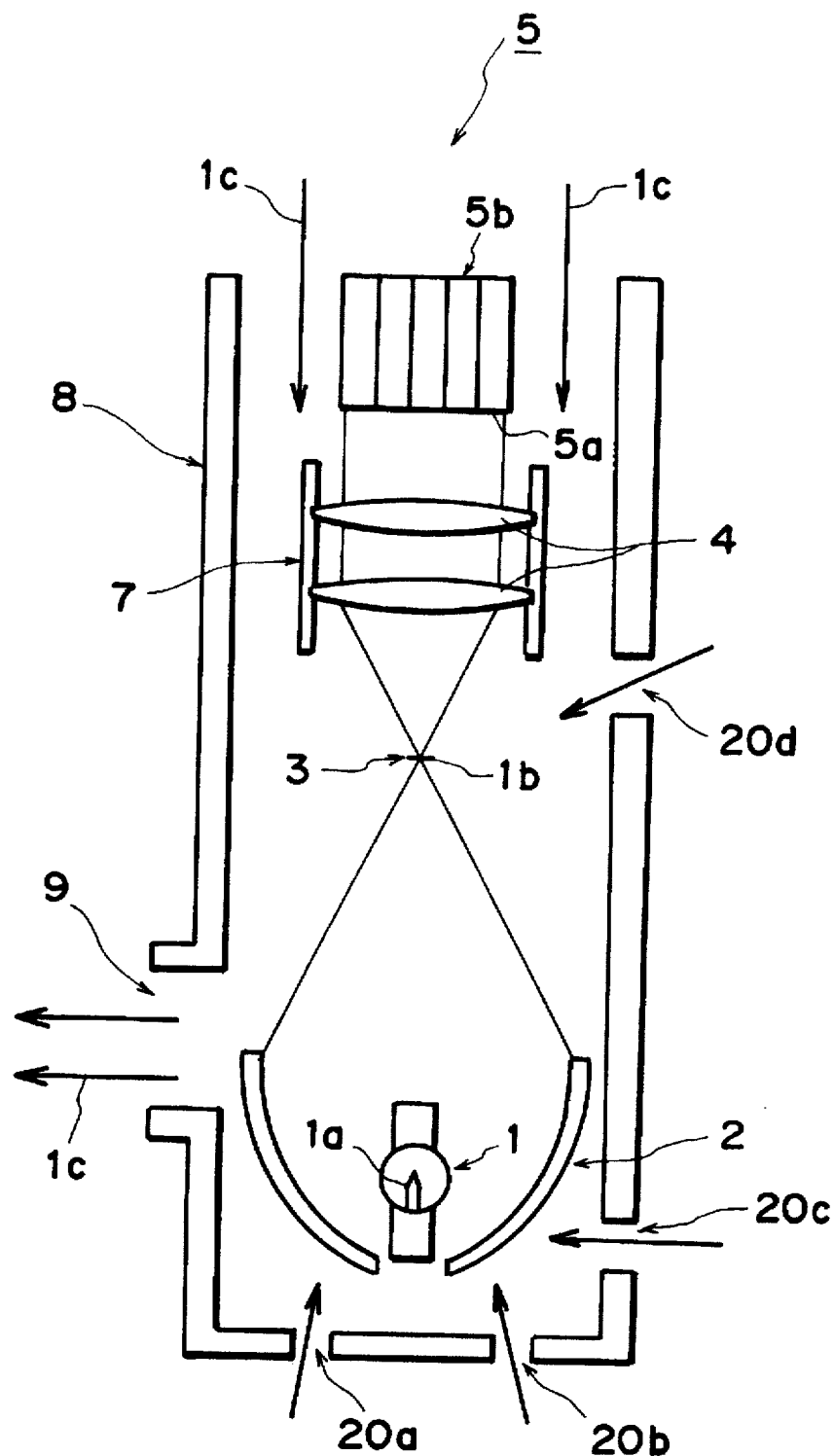
FIG. 1 is a schematic view of a portion of an illumination system of a projection exposure apparatus of a known type.
Figure 2:
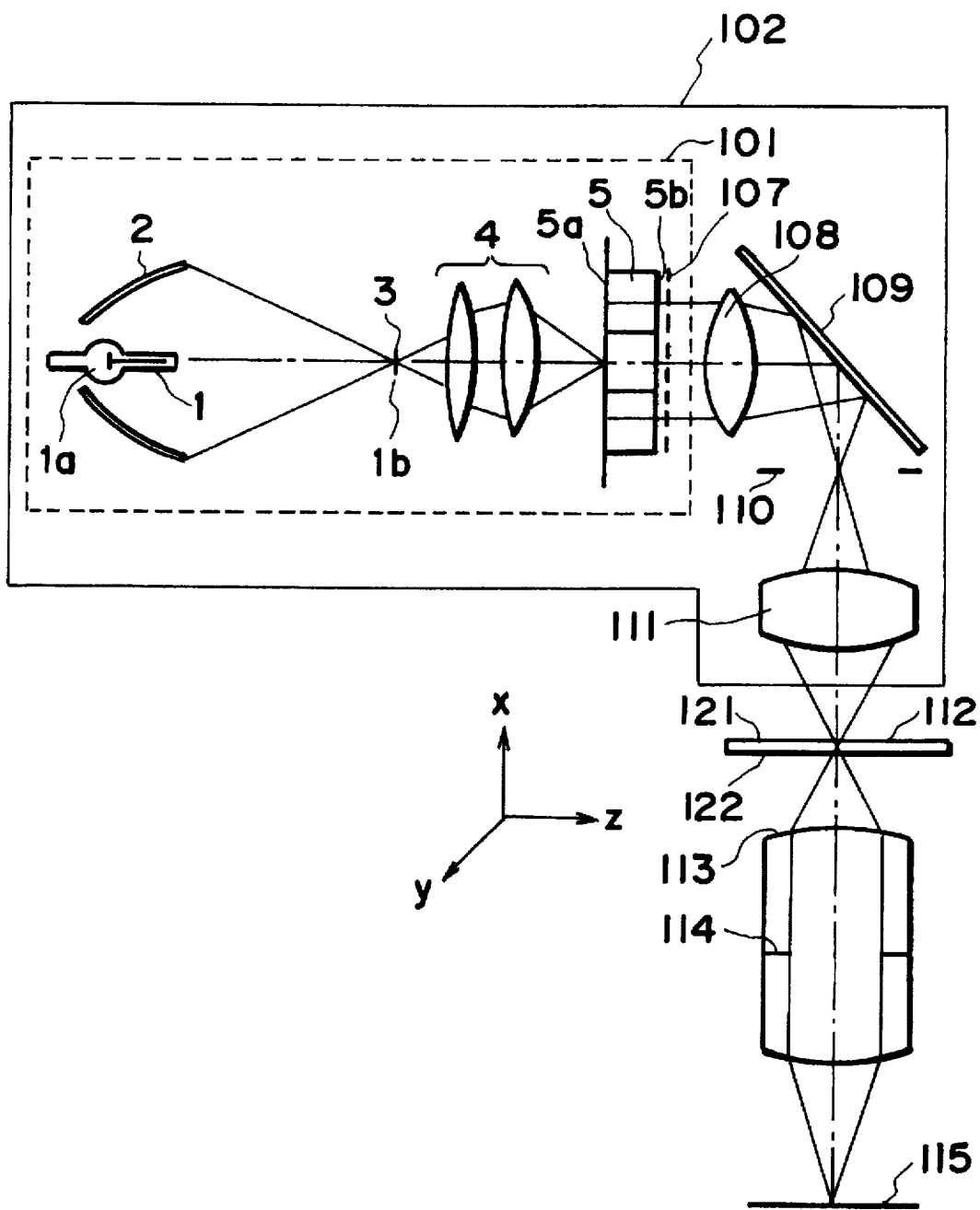
FIG. 2 is a schematic view of a main portion of a projection exposure apparatus according to a first embodiment of the present invention.
Figure 3:
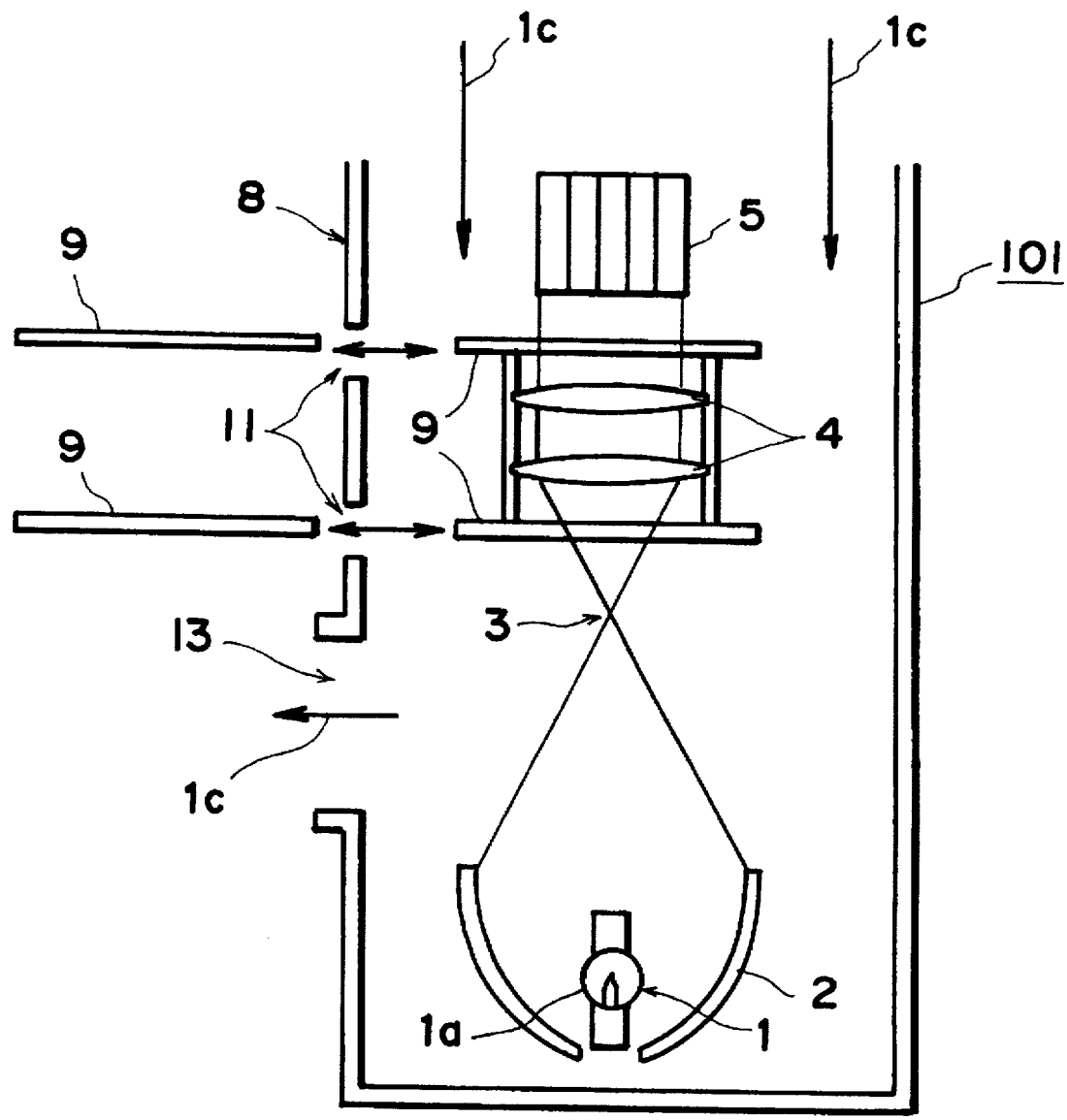
FIG. 3 is a schematic view of illumination means of the projection exposure apparatus of the FIG. 2 embodiment.

FIG. 2 is a schematic view of a main portion of a projection exposure apparatus according to a first embodiment of the present invention. FIG. 3 is a schematic view for explaining illuminating means 101 of the apparatus of FIG. 2.

The projection exposure apparatus of this embodiment is for use in the manufacture of microdevices such as semiconductor chips, liquid crystal panels, magnetic heads, or CCDs, for example.

First, the components of the projection exposure apparatus of FIG. 2 will be explained. Denoted at 102 in the drawing is an illumination system.

Denoted at 2 is an elliptical mirror, and denoted at 1 is a light emitting tube (light source) having a light emitting portion 1a for emitting ultraviolet rays or deep ultraviolet rays, for example. The light emitting portion 1a is disposed about a first focal point of the elliptical mirror 2. The elliptical mirror 2 serves to form an image 1b of the light emitting portion 1a (light source image) at a position about a second focal point 3 of the elliptical mirror.

Denoted at 4 is an optical system which comprises a condenser lens or a zoom lens, for example. It serves to image the light emitting portion image 1b, as formed about the second focal point 3, upon a light entrance surface 5a of an optical integrator 5. The optical integrator 5 comprises a plurality of small lenses (fly's eye lenses) 5i (i=1 to N) which are arrayed two-dimensionally along a plane, intersecting with an optical axis, at a predetermined pitch. The optical integrator 5 serves to define secondary light sources along a plane close to a light exit surface 5b thereof.

Denoted at 107 is a stop having a circular opening, for regulating the size and shape of the secondary light sources. Denoted at 108 is a condensing lens. A plurality of light beams emerging from the secondary light sources defined about the light exit surface 5b of the optical integrator 5, are collected by the condensing lens 108 and are then reflected by a mirror 109 toward a masking blade 110 to illuminate the plane of the masking blade 110 uniformly. The masking blade 110 comprises a plurality of movable blocking plates, being movable along a plane perpendicular to the optical axis to define an opening of a desired shape across the path of light from the secondary light sources.

Denoted at 111 is an imaging lens for imaging the opening of the masking blade 110 on the surface of a reticle 112 (the surface to be illuminated), to thereby illuminate a necessary region of the reticle 112 surface with uniform illuminance.

Denoted at 113 is a projection optical system which comprises a projection lens system, a projection mirror system, a projection lens and mirror system, for example. It serves to project, in a reduced scale, a circuit pattern formed on the reticle 112 upon the surface of a wafer (substrate) 115 placed on a wafer chuck. Denoted at 114 is a pupil (pupil plane) of the projection optical system 113.

In the optical arrangement of this embodiment, the light emitting portion 1a and the second focal point 3 as well as the light entrance surface 5a of the optical integrator 5 are disposed in a substantially optically conjugate relationship with each other. Also, the masking blade 110, the reticle 112 and the wafer 115 are placed in a substantially optically conjugate relationship with each other. Further, the stop 107 and the pupil plane 114 of the projection optical system 113 are disposed in a substantially optically conjugate relationship with each other.

With the structure of this embodiment as described above, the pattern formed on the reticle 112 is projected on the wafer 115 surface in a reduced scale, whereby the pattern is printed thereon. Then, through predetermined processes such as a developing process, for example, semiconductor devices are manufactured.

Next, the structure of illuminating means 101 which constitutes a portion of the illumination system 102 of FIG. 2 will be explained in conjunction with FIG. 3.

In FIG. 3, denoted at 8 is a lamp house (casing) for accommodating the components of the illuminating means 101 of FIG. 2 therein. Denoted at 13 is an exhaust port formed in a portion of the lamp house 8 for exhausting the air in the lamp house 8, having its temperature raised by lighting the light source 1, through this exhaust port 13 under the cooperation of an exhausting means such as a fan (not shown). Arrow 1c depicts the flow of a gas such as air. Denoted at 11 are openings formed in portions of the lamp house 8.

Denoted at 9 are sealing glasses having a high transmissivity to ultraviolet rays. The sealing glasses cooperate with a holding member (barrel) 7, for holding an optical system 4, to gas-tightly enclose the optical system 4 to protect the same against air around it. The sealing glasses 9 are provided by separate elements, separate from the holding member 7, and they are demountably mounted. More specifically, the sealing glasses 9 can be demounted from the optical system 4 and the holding member 7 and can be taken out of the lamp house 8 through the openings 11 formed in the lamp house 8.

In this embodiment, the inside of the casing 8 is cooled by flowing air thereinto such as depicted by the arrow 1c, wherein chemical impurities in the air have been at least partially removed by means of a filter (not shown), for example. The sealing glasses 9 are serviceable to effectively prevent blur or cloudiness of the lens system 4 with such chemical impurities. Use of an impurity removing filter may thus be omitted.

Figure 4:
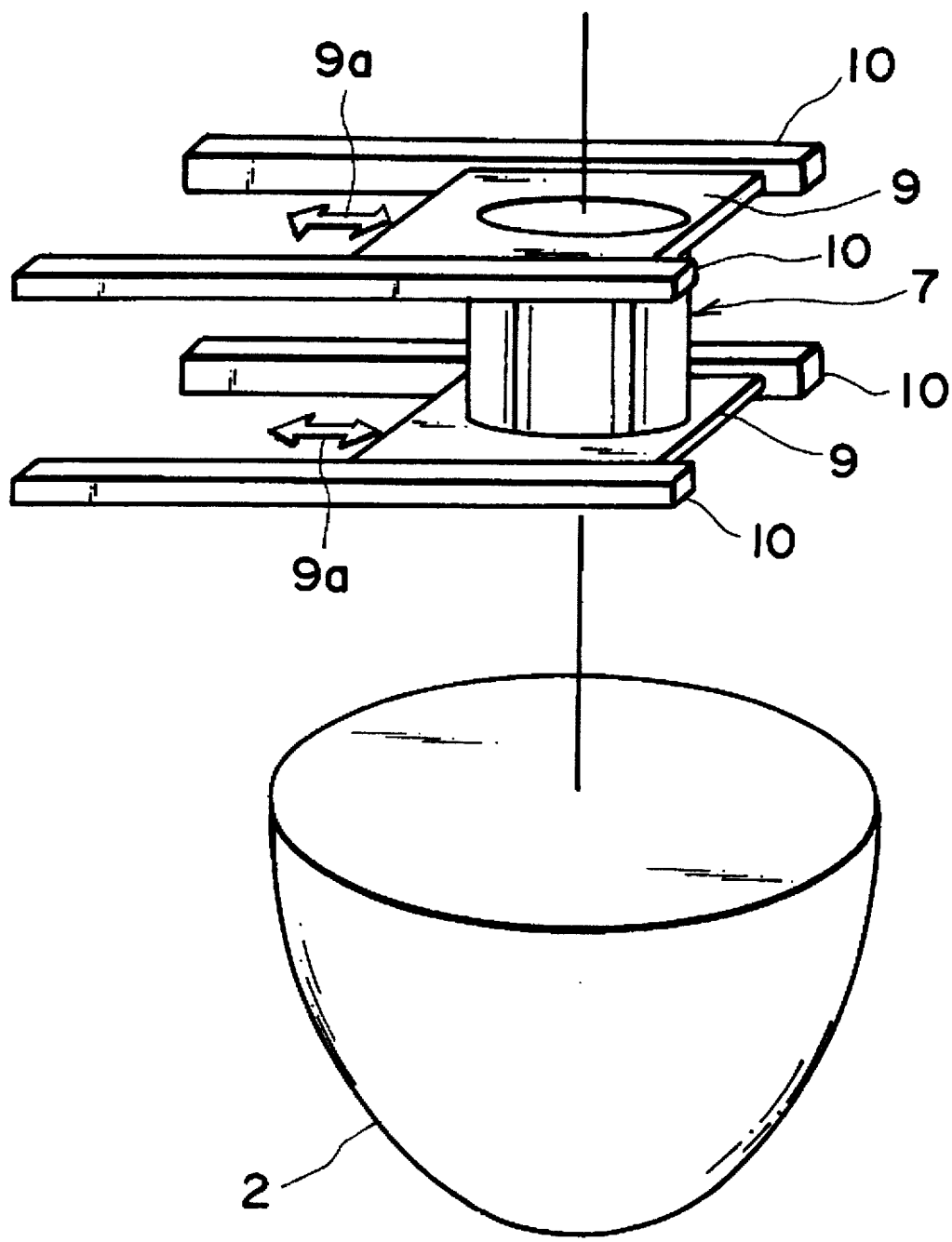
FIG. 4 is an enlarged perspective view of a portion of the projection exposure apparatus of the FIG. 2 embodiment.

FIG. 4 is a schematic view of a main portion of the mechanism in this embodiment, for taking the seal glasses 9 out of the lamp house 8. As illustrated, the seal glasses 9 can be moved along rails provided on side faces of guide members 10 as depicted by arrows 9a, outwardly of the lamp house 8.

The position where the seal glasses 9 are to be set in this embodiment, will now be explained.

In the projection exposure apparatus shown in FIG. 2, intense ultraviolet rays from the light source 1 are concentrated at a position about the second focal point 3 of the elliptical mirror 2 whose first focal point is placed at the light source 1. Thus, the temperature about the second focal point 3 is the highest. Chemical materials floating in the air about the second focal point 3 may thus be easily chemically changed to produce chemical compounds. Such chemical compounds may be deposited on optical components near the second focal point 3, wise temperatures are lower than that at the second focal point 3, to cause blur or cloudiness of the components.

In consideration thereof, in this embodiment, seal glasses are provided to optical components disposed near the second focal point 3 of the elliptical mirror 2 whose first focal point is placed at the light source 1, to prevent illuminance degradation due to blur or cloudiness of that optical component. Such a seal glass may be provided to any other optical component of the optical means 101 to which chemical compounds in the air ere easily deposited.

The seal glass 9 of this embodiment may be provided with a coating (anti-reflection film). Details of such a coating will now be explained.

In the illumination system of this embodiment, light rays are concentrated about the second focal point of the elliptical mirror. Due to the temperature rise as a result of light concentration, the composite of a thin film may easily change to cause a change in transmissivity or reflectivity. In consideration thereof, in this embodiment, no optical thin film is provided on the surface of the seal glass 9 opposed to the light source 1 (that is, the surface of the seal glass facing the second focal point of the elliptical mirror). In place thereof, the surface of the seal glass facing the optical integrator 5 may be provided with a coating.

With the structure of this embodiment as described hereinbefore, it is assured to effectively prevent blur or cloudiness of the optical system 4 due to deposition of impurities thereon, floating in the air and being chemically changed with the exposure process through lighting of the light source 1. As chemical compounds in the air are deposited on the seal glass 9, only the seal glass 9 can be taken out of the casing through the opening 11, for replacement or cleaning of the same. Thus, a decrease of illuminance due to blur is prevented and therefore illumination of the reticle surface with constant illuminance is assured.

FIG. 5 is a schematic view of a main portion of illuminating means 101 in a projection exposure apparatus according to a second embodiment of the present invention. In FIG. 5, reference numerals the same as those of FIG. 3 are assigned to corresponding elements, This embodiment differs from the first embodiment of FIG. 3 in the points that: in this embodiment, light from the light source 1 is directed by reflection by a mirror 6 to the optical system 4; a sealing glass 9 is provided at the reflection surface side of the mirror 6, to prevent deposition of chemical compounds on the mirror 6 reflection surface with the lighting of the light source 1 to thereby avoid blur or cloudiness of the mirror 6 surface; and the mirror 6 and the seal glass 9 are able to be taken out of the illuminating means 101 through an opening 11. The remaining portion of this embodiment is of substantially the same structure as that of the preceding embodiment.

This embodiment has a feature that the optical component 6 on which the seal glass 9 is mounted is taken out of the illuminating means 101 together with the seal glass 9, rather than only the seal glass 9 being taken out of the illuminating means 101. This structure is effective to provide enhanced gas-tightness between the optical component and the seal glass to avoid blur of the optical component itself. As illuminance degradation due to blur or cloudiness occurs, the mirror 6 with the seal glass may be taken out of the illuminating means 101, and the seal glass may be replaced by another or it may be cleaned. Thus, it is possible to meet illuminance degradation due to blur, promptly.

The concepts of the first and second embodiments may be used in the same illumination system, but selectively applied to optical components of the illuminating means in accordance with the shape of each component or the frequency of occurrence of blur or cloudiness.

Figure 6:
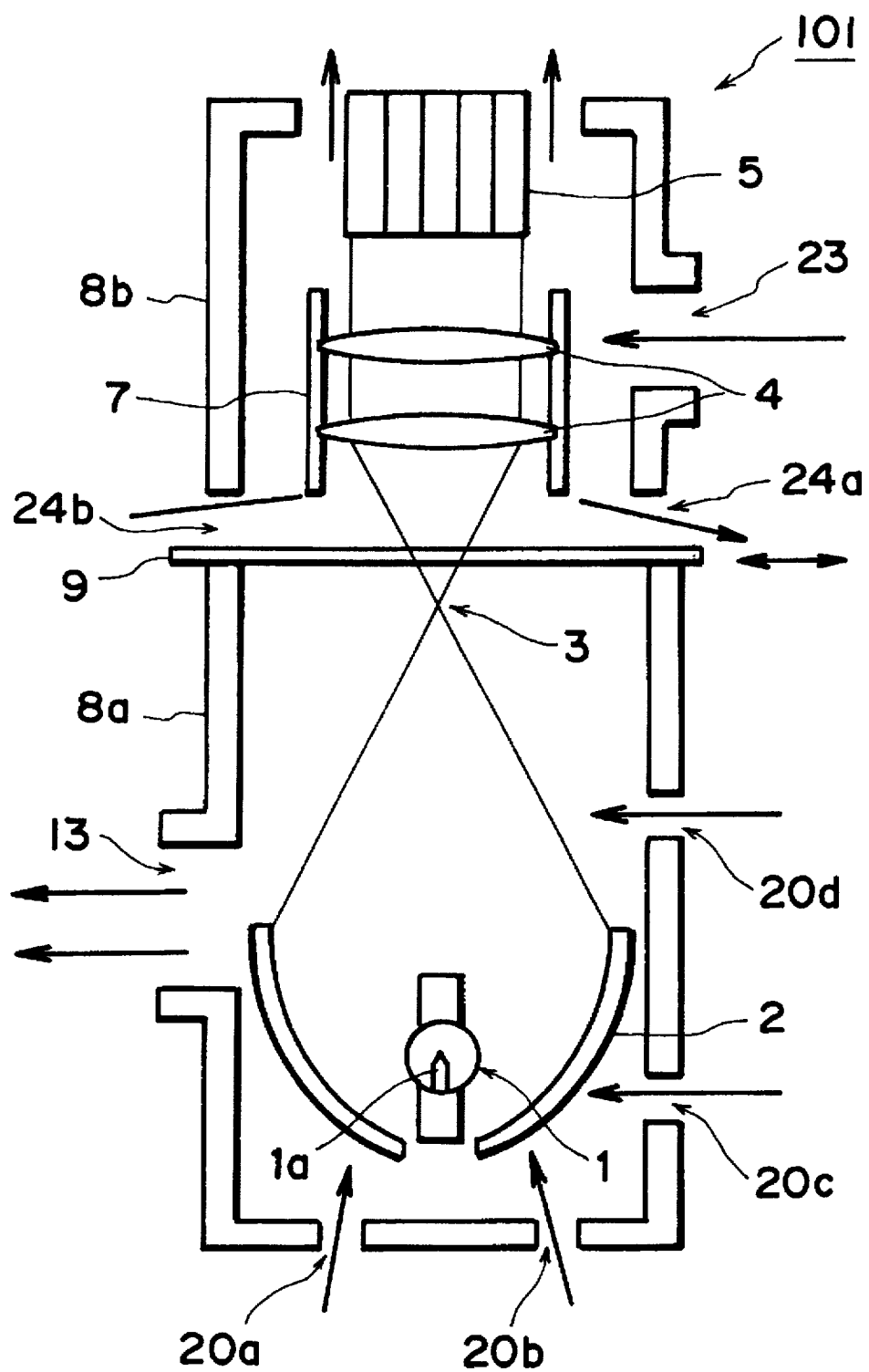
FIG. 6 is a schematic view of a main portion of an illumination system according to a third embodiment of the present invention.

FIG. 6 is a schematic view of a main portion of illuminating means 101 of a projection exposure apparatus according to a third embodiment of the present invention. Reference numerals of FIG. 6 the same as those of FIG. 3 are assigned to corresponding elements.

This embodiment differs from the embodiment of FIG. 3 in the points that: the lamp house 8 is divided into a first casing 8a having a light source 1 and a second casing 8b having no light source, these first and second casings being separated by a seal glass 9 such that the air in the focal point 3 side lamp house does not contact optical components other than the elliptical mirror 2; and the interiors of the first and second casings 8a and 8b are cooled independently by means of air or cooled gases. The remaining portion of this embodiment is of essentially the same structure as that of the embodiment of FIG. 3.

In FIG. 6, denoted at 20a–20d are openings formed in the casing 8a, through which cooling air or gases are introduced into the casing 8a. In this embodiment, the air within the casing 8a as heated by lighting the light source 1 is discharged out the illuminating means 101 through an exhaust port 13 with the introduction of air or gases through the inlet ports 20a–20d.

The seal glass 9 is demountably mounted on a portion of the casing 8a, and it is able to be demounted and directly taken out of the illuminating means 101 without demounting a cover of the illuminating means 101.

The casing 8b serves as a light blocking member for avoiding leakage of inside light outwardly of the illuminating means 101 and also as a holding member for keeping the gas-tightness and maintaining a positive pressure therein against an ambience.

Denoted at 23 is an air inlet port formed in a portion of the casing 8b. Cooled air or cooled gas such as an inactive gas of nitrogen or helium, having chemical impurities removed by a filter, for example, is introduced through this inlet port 23 into the casing 8b, by means of an exhaust means such as a fan (not shown), for example, so as to prevent temperature rise of components within the casing 8b. The air or gas within the casing 8b is discharged outwardly of the illuminating means 101 through openings 24a and 24b.

In this embodiment, the casing 8b has enhanced gas-tightness, and a positive pressure as compared with an ambience pressure is maintained therein. Also, the air or gas which is introduced through the inlet port 23, is effective to prevent flow of a gas into the casing, which gas might cause blur or cloudiness of optical components in the casing, and additionally, is effective to prevent temperature rise within the casing 8b. Since the temperature rise within the casing 8b is effectively prevented, unwanted effects due to thermal expansion of optical components within the casing is effectively avoided.

The seal glass 9 of this embodiment is easily demountable out of the illuminating means 101.

Conventionally, as compared therewith, if illuminance degradation due to blur occurs, an optical component or components which are expected as being blurred have to be demounted together with the barrel, from the illuminating means for cleaning of the cloudiness or for replacement of the blurred lens or the like. This requires complicated operations and it increases cost.

In the present embodiment, to the contrary, the air which contains chemical compounds is prevented from directly contacting the optical components such as a lens, by means of the seal glass 9. Blur due to material deposition may occur on the seal glass 9, but blur of optical components such as a lens is prevented. Thus, a possible illuminance degradation due to blur can be easily met by simply demounting the seal glass and by cleaning it or replacing it by another.

In this embodiment, because of a possibility of a temperature rise at the surface of the seal glass 9 facing the light source 1, a thin film, if provided on that surface of the seal glass 9, will easily optically change to cause a change in transmissivity. Thus, no coating is provided on that surface of the seal glass 9, but only the surface of the seal glass 9 facing the optical system 4 is provided with a coating.

Figure 7:
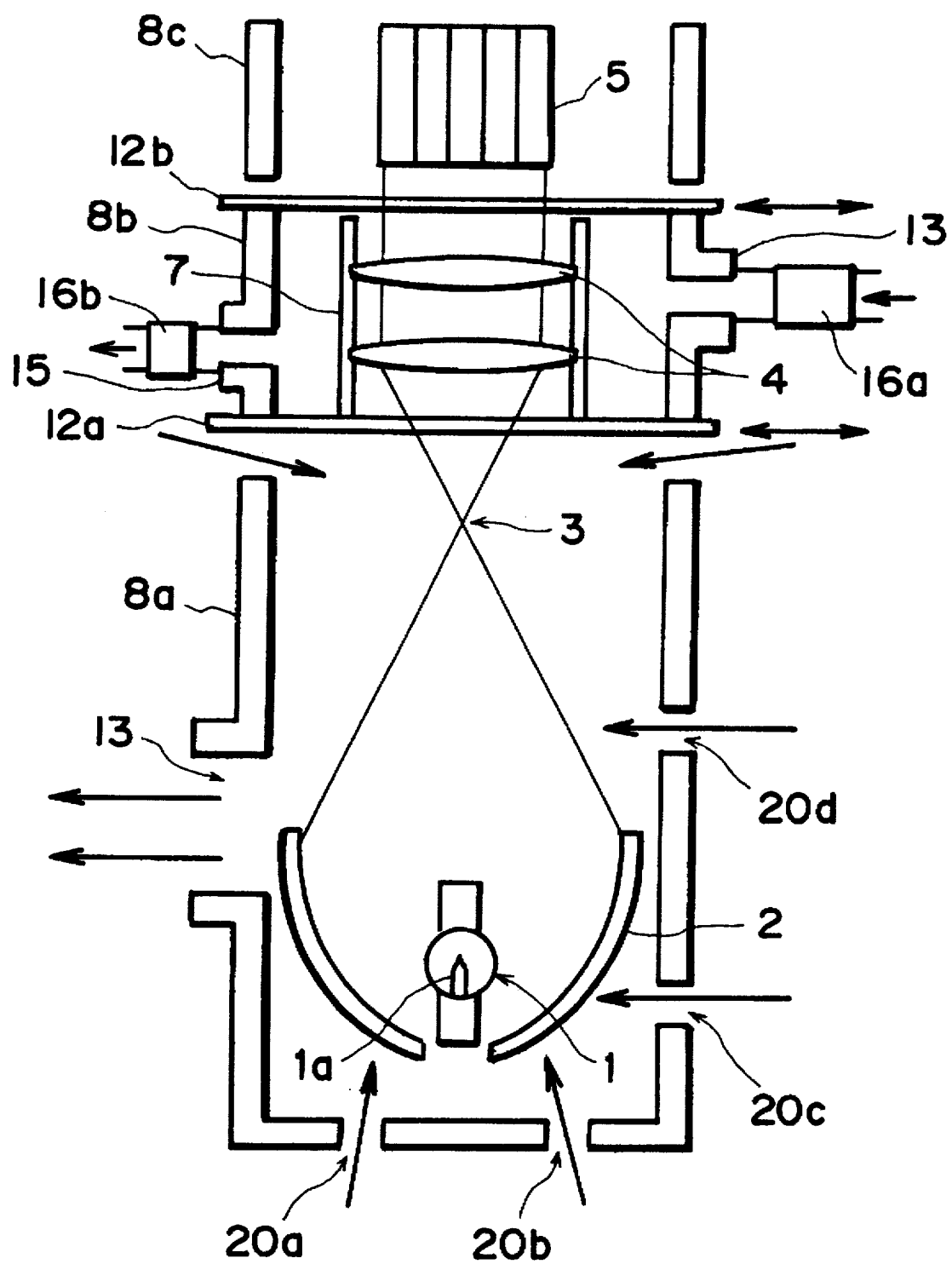
FIG. 7 is a schematic view of a main portion of an illumination system according to a fourth embodiment of the present invention.

FIG. 7 is a schematic view of a main portion of illuminating means 101 of a projection exposure apparatus according to a fourth embodiment of the present invention. Reference numerals of FIG. 7 the same as those of FIG. 6 are assigned to corresponding elements.

This embodiment differs from the third embodiment of FIG. 6 in the point that the lamp house 8 is divided into three casings 8a, 8b and 8c by means of two seal glasses 12a and 12b. The remaining portion of this embodiment is of substantially the same structure as that of the embodiment of FIG. 3.

In this embodiment, those optical components with respect to which occurrence of blur or cloudiness is expected, are enclosed by a casing member and, while keeping the inside gas-tightness of the casing member, the casing member is filled with clean air and it is sealed. More specifically, the casing member 8b that covers the optical system 4 with respect to which occurrence of blur or cloudiness is expected is maintained in a gas-tight state, except for a gas inlet port 13 and a gas outlet port 15. The light entrance side and light exit side of the optical system 4 are gas-tightly closed by the seal glasses 12a and 12b which are demountbly mountable from the outside of the illuminating means 101.

Air or nitrogen gas, for example, whose chemical impurities have been removed by means of a filter, for example, is introduced into the casing 8b through a valve 16a and through the inlet port 13. The air or gas introduced into the casing 8b is diffused by the barrel or by any other mechanical members so that the interior of the casing 8b is filled with the gas. The filling gas is then discharged outwardly of the illuminating means 101 through the outlet port 15 and through a valve 16b.

In this embodiment, the introduction of clean air or gas into the casing 8b is continued for a predetermined time period until substantially all chemical compounds or impurities therein are discharged out of the casing. Then, the valves 16a and 16b are closed to stop the air flow. Thus, the casing 8b is filled with clean air or gas, and deposition of blur on optical components therein is effectively prevented. When, in this embodiment, the illuminance on the surface to be illuminated is degraded due to deposition of blur on the surface of the seal glass 12a facing the lamp 10 the seal glass 12a may be demounted out of the illuminating means 101 and it may be cleaned or replaced by another. Thus, it is possible to promptly meet illuminance degradation due to deposition of chemical compounds about the light source 1.

When the seal glass is demounted, the lenses of the optical system 4 may contact air containing chemical compounds which may cause deposition of chemical compounds to cause blur thereon. In consideration of this, in this embodiment, after the cleaned seal glass or a fresh seal glass is inserted and mounted into the illuminating means, the casing 8b is filled with clean air or gas, again, in the manner as described above. This effectively prevents lens blur.

Similar inlet end outlet ports as well as similar valves to those of this embodiment may be provided to the other casing members, and seal glasses may be disposed to prevent possible contact of the air heated by the light source 1 to optical elements therein. Substantially the same advantageous effects are obtainable on that occasion.

Next, an embodiment of a device manufacturing method which uses any one of the projection exposure apparatuses having been described hereinbefore, will be explained.

Figure 8:
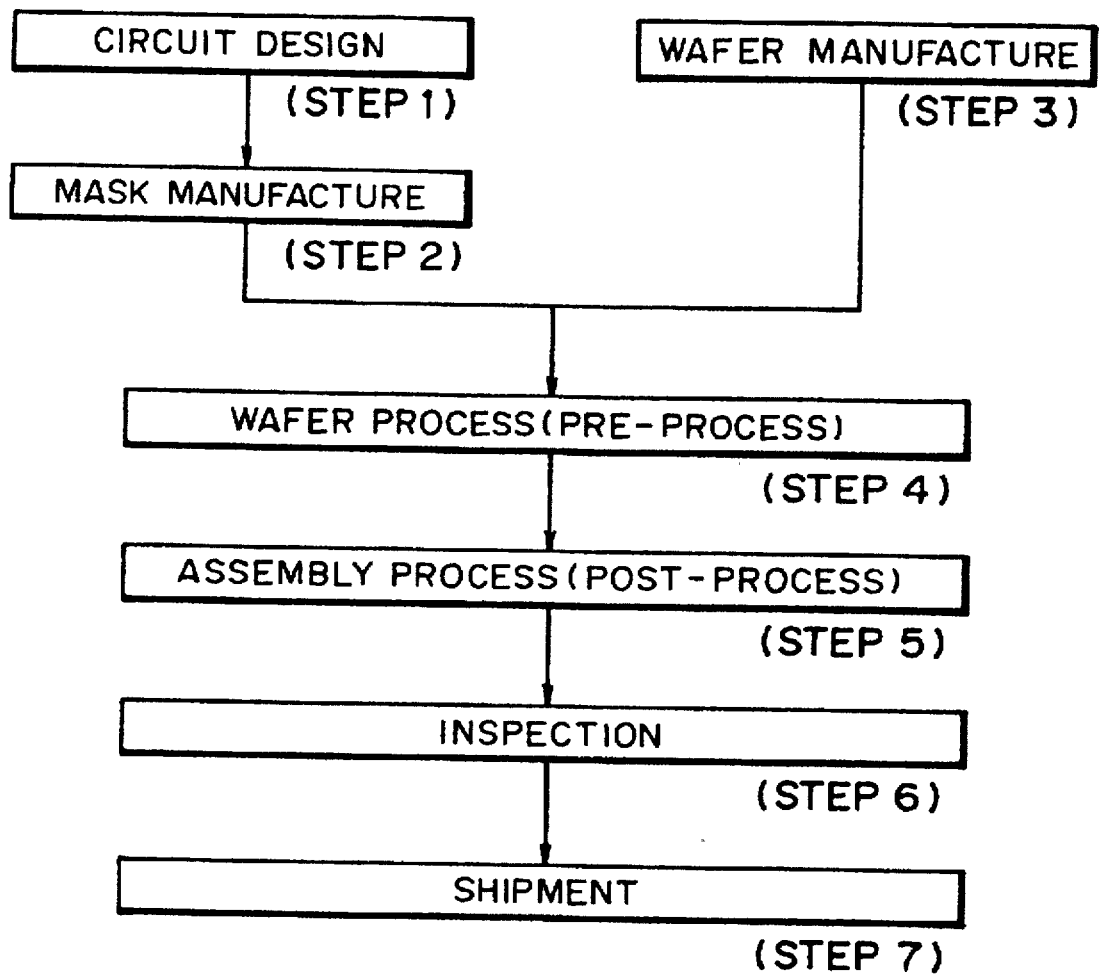
FIG. 8 is a flow chart of device manufacturing processes.

FIG. 8 is a flow chart of the sequence of manufacturing a microdevice such as a semiconductor chip (e.g., IC or an LSI), a liquid crystal panel or a CCD, for example. Step 1 is a design process for designing the circuit of a device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5, subsequent to this, is an assembling step which is called a post-process wherein the wafer processed by Step 4 is formed into chips. This step includes assembling (dicing and bonding) and packaging (chip sealing). Step 6 is an inspection step wherein an operability check, a durability check and so on of the devices produced by step 5 are carried out. With these processes, devices are finished and they are shipped (step 7).

Figure 9:
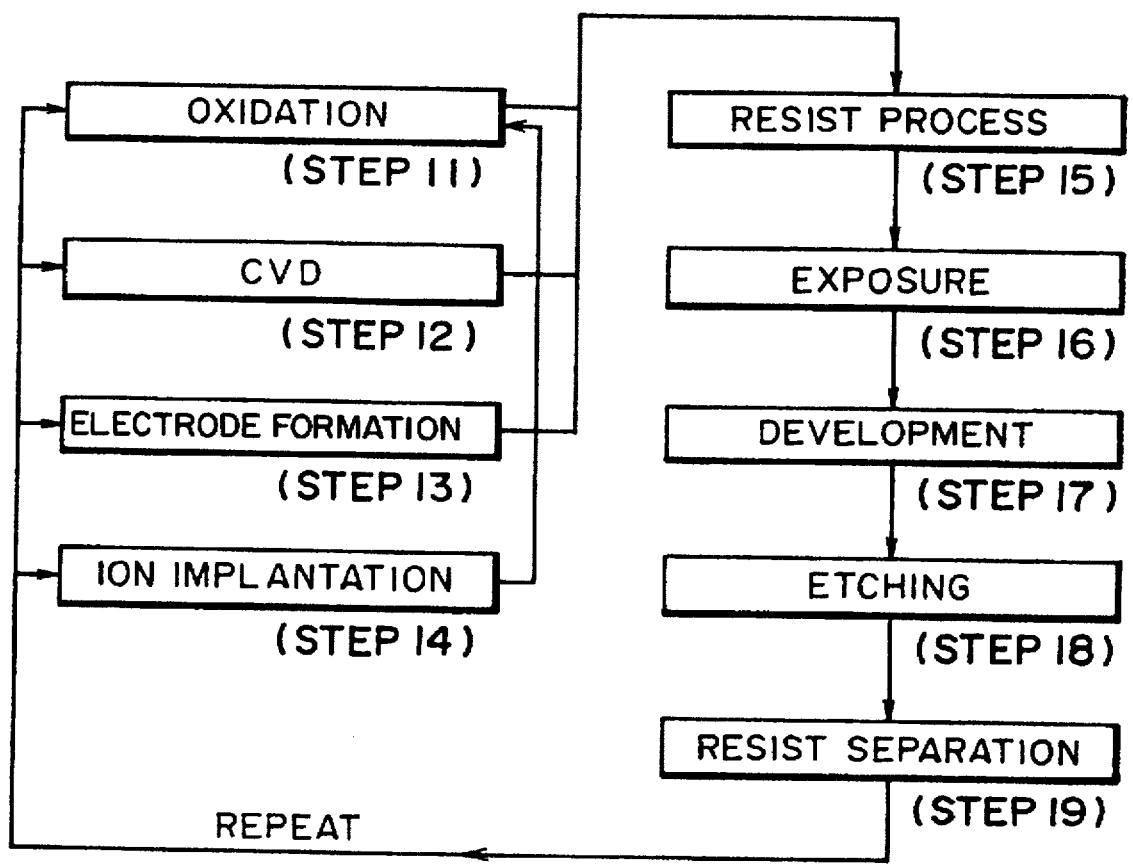
FIG. 9 is a flow chart of a wafer process.

FIG. 9 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. An illumination system, comprising:

an optical system for receiving light from a light source;

a barrel for accommodating the light source and said optical system therein, said barrel having an inside gas containing a material which may cause blur of an optical element of said optical system; and a transparent protecting member demountably disposed in said barrel, for protecting the optical element against the material.

2. An illumination system according to claim 1, wherein said optical element comprises a reflection mirror, and wherein said protecting member covers a reflection surface of said reflection mirror.

3. An illumination system according to claim 1, wherein said optical element comprises a lens, and wherein said protecting member covers a refraction surface of said lens.

4. An illumination system according to claim 3, wherein said optical element further comprises a reflection mirror, and wherein said protecting member covers a reflection surface of said reflection mirror.

5. An illumination system according to claim 1, wherein said protecting member is provided to gas-tightly close an ambience around said optical element, and wherein said illumination system further comprises gas flowing means for flowing a second gas into said ambience around said optical element, said second gas substantially not containing said material.

6. An illumination system according to claim 5, wherein said gas flowing means comprises cooling means for cooling the second gas.

7. An illumination system according to claim 5, wherein said second gas substantially consists of an inactive gas.

8. An illumination system according to claim 5, wherein said optical element comprises a lens system, and wherein said illumination system comprises a pair of protecting members provided at a light entrance side and a light exit side of said lens system.

9. An illumination system according to claim 1, further comprising inside gas flowing means for flowing said inside gas within said barrel.

10. An illumination system according to claim 1, further comprising gas flowing means for flowing a second gas to an ambience around said optical element, said second gas substantially not containing said material.

11. An illumination system according to claim 10, wherein said gas flowing means comprises cooling means for cooling said second gas.

12. An illumination system according to claim 10, wherein said second gas substantially consists of an inactive gas.

13. An illumination system according to claim 1, wherein said light source comprises a lamp and a concave mirror.

14. An illumination system according to claim 13, wherein said optical system includes an optical integrator, and wherein said optical element serves to direct the light from said lamp and reflected by said concave mirror to said optical integrator.

15. An exposure apparatus, comprising:
    an optical system for receiving light from a light source;
    a barrel for accommodating the light source and said optical system therein, said barrel having an inside gas containing a material which may cause blur of an optical element of said optical system; and
    a transparent protecting member demountably disposed in said barrel, for protecting the optical element against the material.

16. An apparatus according to claim 15, wherein said optical element comprises a reflection mirror, and wherein said protecting member covers a reflection surface of said reflection mirror.

17. An apparatus according to claim 15, wherein said optical element comprises a lens, and wherein said protecting member covers a refraction surface of said lens.

18. An apparatus according to claim 17, wherein said optical element further comprises a reflection mirror, and wherein said protecting member covers a reflection surface of said reflection mirror.

19. An apparatus according to claim 15, wherein said protecting member is provided to gas-tightly close an ambience around said optical member, and wherein said apparatus further comprises gas flowing means for flowing a second gas into said ambience around said optical member, said second gas substantially not containing said material.

20. An apparatus according to claim 19, wherein said gas flowing means comprises cooling means for cooling the second gas.

21. An apparatus according to claim 19, wherein said second gas substantially consisting of an inactive gas.

22. An apparatus according to claim 19, wherein said optical element comprises a lens system, and wherein said apparatus comprises a pair of protecting members provided at a light entrance side and a light exit side of said lens system.

23. An apparatus according to claim 15, further comprising inside gas flowing means for flowing said inside gas within said barrel.

24. An apparatus according to claim 15, further comprising gas flowing means for flowing a second gas to an ambience around said optical element, said second gas substantially not containing said material.

25. An apparatus according to claim 24, wherein said gas flowing means comprises cooling means for cooling said second gas.

26. An apparatus according to claim 24, wherein said second gas substantially consists of an inactive gas.

27. An apparatus according to claim 15, wherein said light source comprises a lamp and a concave mirror.

28. An apparatus according to claim 27, wherein said optical system includes an optical integrator, and wherein said optical element serves to direct the light from said lamp and reflected by said concave mirror to said optical integrator.

29. An apparatus according to claim 15, further comprising a projection optical device for projecting, onto a substrate, a pattern of a mask illuminated with light from said optical system.

30. A device manufacturing method which includes a step of printing a device pattern on a substrate by use of an exposure apparatus as recited in any one of claims 15–29.

31. An illumination system for illuminating a mask having a pattern to be projected to a substrate, said system comprising:
    an optical element for receiving light from a light source; and
    a transparent protection member detachably disposed on a path of the light, said protection member protecting said optical element against a material which is contained in a gas inside of said illumination system and which may contaminate said optical element,
    wherein said optical element and said transparent protecting member are disposed between the light source and the mask.

32. An illumination system according to claim 31, wherein said optical element comprises a reflection mirror, and wherein said protection member covers a reflection surface of said reflection mirror.

33. An illumination system according to claim 31, wherein said optical element comprises a lens, and wherein said protection member covers a refraction surface of said lens.

34. An illumination system according to claim 33, wherein said optical element further comprises a reflection mirror, and wherein said protection member covers a reflection surface of said reflection mirror.

35. An illumination system according to claim 31, wherein said protection member is provided to gas-tightly close an ambience around said optical element, and wherein said illumination system further comprises gas flowing means for flowing a second gas into said ambience around said optical element, said second gas substantially not containing said material.

36. An illumination system according to claim 35, wherein said gas flowing means comprises cooling means for cooling the second gas.

37. An illumination system according to claim 35, wherein said second gas substantially consists of an inactive gas.

38. An illumination system according to claim 35, wherein said optical element comprises a lens system, and wherein said illumination system comprises a pair of protecting members provided at a light entrance side and a light exit side of said lens system.

39. An illumination system according to claim 31, further comprising a barrel for accommodating the light source and said optical element therein, and inside gas flowing means for flowing said inside gas within said barrel.

40. An illumination system according to claim 31, further comprising gas flowing means for flowing a second gas to an ambience around said optical element, said second gas substantially not containing said material.

41. An illumination system according to claim 40, wherein said gas flowing means comprises cooling means for cooling said second gas.

42. An illumination system according to claim 40, wherein said second gas substantially consists of an inactive gas.

43. An illumination system according to claim 31, wherein said light source comprises a lamp and a concave mirror.

44. An illumination system according to claim 43, wherein said optical system includes an optical integrator, and wherein said optical element serves to direct the light from said lamp and reflected by said concave mirror to said optical integrator.

45. An exposure apparatus for exposing a substrate to a pattern of a mask, said apparatus comprising:

an optical element for receiving light from a light source; and a transparent protection member detachably disposed on a path of the light, said protection member protecting said optical element against a material which is contained in a gas inside of said illumination system and which may contaminate said optical element, wherein said optical element and said transparent protecting member are disposed between the light source and the mask.

46. An exposure apparatus according to claim 45, wherein said optical element comprises a reflection mirror, and wherein said protection member covers a reflection surface of said reflection mirror.

47. An exposure apparatus according to claim 45, wherein said optical element comprises a lens, and wherein said protection member covers a refraction surface of said lens.

48. An exposure apparatus according to claim 47, wherein said optical element further comprises a reflection mirror, and wherein said protection member covers a reflection surface of said reflection mirror.

49. An exposure apparatus according to claim 45, wherein said protection member is provided to gas-tightly close an ambience around said optical element, and wherein said illumination system further comprises gas flowing means for flowing a second gas into said ambience around said optical element, said second gas substantially not containing said material.

50. An exposure apparatus according to claim 49, wherein said gas flowing means comprises cooling means for cooling the second gas.

51. An exposure apparatus according to claim 49, wherein said second gas substantially consists of an inactive gas.

52. An exposure apparatus according to claim 49, wherein said optical element comprises a lens system, and wherein said illumination system comprises a pair of protecting members provided at a light entrance side and a light exit side of said lens system.

53. An exposure apparatus according to claim 45, further comprising a barrel for accommodating the light source and said optical element therein, and inside gas flowing means for flowing said inside gas within said barrel.

54. An exposure apparatus according to claim 45, further comprising gas flowing means for flowing a second gas to an ambience around said optical element, said second gas substantially not containing said material.

55. An exposure apparatus according to claim 54, wherein said gas flowing means comprises cooling means for cooling said second gas.

56. An exposure apparatus according to claim 54, wherein said second gas substantially consists of an inactive gas.

57. An exposure apparatus according to claim 54, wherein said light source comprises a lamp and a concave mirror.

58. An exposure apparatus according to claim 57, wherein said optical system includes an optical integrator, and wherein said optical element serves to direct the light from said lamp and reflected by said concave mirror to said optical integrator.

59. An exposure apparatus according to claim 54, further comprising a projection optical device for projecting, onto the substrate, the pattern of the mask illuminated with light from said optical system.

60. A device manufacturing method which includes printing a device pattern on a substrate by using an exposure apparatus as recited in any one of claim 45–59.

* * * * *

UNITED STATES PATENT AND TRADEMARK OFFICE
CERTIFICATE OF CORRECTION

PATENT NO. : 5,701,169
DATED : December 23, 1997
INVENTOR(S) : HITOSHI YOSHIOKA

It is certified that error appears in the above-indentified patent and that said Letters Patent is hereby corrected as shown below:

COLUMN 4:

Line 40, "embodiment," should read --embodiment--; and
     Line 60, "ere" should read --are--.

COLUMN 6:

Line 33, "23," should read --23--.

COLUMN 7:

Line 21, "demountbly" should read --demountably--.

COLUMN 9:

Line 49, "member," should read --element,--;
     Line 51, "member," should read --element,--; and
     Line 57, "consisting" should read --consists--.

Signed and Sealed this

Seventh Day of July, 1998

Attest:

BRUCE LEHMAN

*Attesting Officer*     *Commissioner of Patents and Trademarks*